(12) United States Patent
Kim et al.

(10) Patent No.: US 10,046,353 B2
(45) Date of Patent: Aug. 14, 2018

(54) MICROSCALE STAMP WITH REVERSIBLE ADHESION FOR TRANSFER PRINTING

(71) Applicant: The Board of Trustees of the University of Illinois, Urbana, IL (US)

(72) Inventors: Seok Kim, Urbana, IL (US); Jeffrey D. Eisenhaure, Champaign, IL (US)

(73) Assignee: THE BOARD OF TRUSTEES OF THE UNIVERSITY OF ILLINOIS, Urbana, IL (US)

(*) Notice: Subject to any disclaimer, the term of this patent is extended or adjusted under 35 U.S.C. 154(b) by 103 days.

(21) Appl. No.: 14/732,143

(22) Filed: Jun. 5, 2015

(65) Prior Publication Data
US 2015/0352586 A1    Dec. 10, 2015

Related U.S. Application Data

(60) Provisional application No. 62/039,743, filed on Aug. 20, 2014, provisional application No. 62/008,773, filed on Jun. 6, 2014.

(51) Int. Cl.
| | |
|---|---|
| *B29C 33/00* | (2006.01) |
| *B29C 33/42* | (2006.01) |
| *B05C 1/02* | (2006.01) |
| *B05C 11/00* | (2006.01) |
| *B81C 1/00* | (2006.01) |
| *B81C 99/00* | (2010.01) |
| *G03F 7/00* | (2006.01) |

(52) U.S. Cl.
CPC ............... *B05C 1/02* (2013.01); *B05C 11/00* (2013.01); *B81C 1/0046* (2013.01); *B81C 99/009* (2013.01); *G03F 7/0002* (2013.01)

(58) Field of Classification Search
CPC .. B05C 1/02; B05C 11/00; B05D 1/28; B29C 39/148; B29C 39/203; G03F 7/0002
USPC ................... 425/375, 385; 264/219; 977/887
See application file for complete search history.

(56) References Cited

U.S. PATENT DOCUMENTS

| | | | |
|---|---|---|---|
| 6,986,855 B1* | 1/2006 | Hood ...................... | B29C 33/44 264/101 |
| 8,057,891 B2 | 11/2011 | Cheng et al. | |
| 8,062,568 B2* | 11/2011 | Lee ..................... | B81C 99/0025 264/219 |

(Continued)

OTHER PUBLICATIONS

Spearing, S. M., "Materials Issues in Microelectromechanical Systems (MEMS)," *Acta Materialia*, 48 (2000) pp. 179-196.

(Continued)

*Primary Examiner* — Joseph S Del Sole
*Assistant Examiner* — Thu Khanh T Nguyen
(74) *Attorney, Agent, or Firm* — Brinks Gilson & Lione

(57) ABSTRACT

A microscale stamp for transfer printing includes (a) a stamp body comprising a shape memory polymer having a glass transition temperature ($T_g$) and (b) one or more protruding structures attached to a surface of the stamp body. The shape memory polymer comprises a deformable state at temperatures above $T_g$ and a rigid state at temperatures below $T_g$. The one or more protruding structures comprise a material which is different from the shape memory polymer and which has a Young's modulus greater than a storage modulus of the shape memory polymer.

27 Claims, 6 Drawing Sheets

(56) References Cited

U.S. PATENT DOCUMENTS

| | | | |
|---|---|---|---|
| 8,093,340 B2 | 1/2012 | Xie et al. | |
| 8,236,129 B2 | 8/2012 | Xie et al. | |
| 8,237,324 B2 | 8/2012 | Pei et al. | |
| 8,251,163 B2 | 8/2012 | Xie et al. | |
| 8,628,838 B2 | 1/2014 | Xie et al. | |
| 8,685,528 B2 | 4/2014 | Xie et al. | |
| 2009/0289029 A1* | 11/2009 | Vecchione | B81C 99/009 264/219 |
| 2010/0123268 A1* | 5/2010 | Menard | H01L 21/6835 264/293 |
| 2010/0316845 A1* | 12/2010 | Rule | B29C 61/0608 428/172 |
| 2013/0069275 A1 | 3/2013 | Menard et al. | |
| 2013/0302464 A1* | 11/2013 | Zheng | G03F 7/0002 425/385 |
| 2014/0069578 A1 | 3/2014 | Xie et al. | |

OTHER PUBLICATIONS

Zhang, Yong et al., "Autonomous Robotic Pick- and-Place of Microobjects," *IEEE Transactions on Robotics*, 26, 1 (Feb. 2010), pp. 200-207.

Miyazaki, Hideki T. et al., "Adhesion of micrometer-sized polymer particles under a scanning electron microscope," *Journal of Applied Physics*, 88, 6 (Sep. 15, 2000), pp. 3330-3340.

Haliyo, D. Sinan et al., "Advanced applications using [mü]MAD, the adhesion based dynamic micro-manipulator," *Proceedings of the 2003 IEEE/ASME International Conference on Advanced Intelligent Mechatronics* (AIM 2003), pp. 880-885.

Dechev, Nikolai et al., "Microassembly of 3-D Microstructures Using a Compliant, Passive Microgripper," *Journal of Microelectromechanical Systems*, 13, 2 (Apr. 2004), pp. 176-189.

Saito, Shigeki et al., "Non-impact deposition for electrostatic micromanipulation of a conductive particle by a single probe," *Journal of Micromechanics and Microengineering*, 18 (2008), 107001 (3 pp).

Fuchiwaki, Ohmi et al., "Multi-axial Micromanipulation Organized by Versatile Micro Robots and Micro Tweezers," *2008 IEEE International Conference on Robotics and Automation*, Pasadena, CA, USA, May 19-23, 2008, pp. 893-898.

Meitl, Matthew A. et al., "Transfer printing by kinetic control of adhesion to an elastomeric stamp," *Nature Materials*, 5 (Jan. 2006), pp. 33-38.

Carlson, Andrew et al., "Shear-enhanced adhesiveless transfer printing for use in deterministic materials assembly," *Applied Physics Letters*, 98 (2011), pp. 264104-1-264104-3.

Yang, Sang Yoon et al., "Elastomer Surfaces with Directionally Dependent Adhesion Strength and Their Use in Transfer Printing with Continuous Roll-to-Roll Applications," *Advanced Materials*, 24 (2012), pp. 2117-2122.

Saeidpourazar, Reza et al., "Laser-Driven Micro Transfer Placement of Prefabricated Microstructures," *Journal of Microelectromechanical Systems*, 21, 5 (Oct. 2012), pp. 1049-1058.

Carlson, Andrew et al., "Active, Programmable Elastomeric Surfaces with Tunable Adhesion for Deterministic Assembly by Transfer Printing," *Advanced Functional Materials*, 22 (2012), pp. 4476-4484.

Yang, Yumi et al., "Arrays of Silicon Micro / Nanostructures Formed in Suspended Configurations for Deterministic Assembly Using Flat and Roller-Type Stamps," *Small*, 7, 4 (2011), pp. 484-491.

Xie, Tao et al., "Facile tailoring of thermal transition temperatures of epoxy shape memory polymers," *Polymer*, 50 (2009), pp. 1852-1856.

Xie, Tao et al., "Self-Peeling Reversible Dry Adhesive System," *Chem. Mater.*, 20 (2008), pp. 2866-2868.

Wanka, Stefanie et al., "Measuring Adhesion Forces in Powder Collectives by Inertial Detachment," *Langmuir*, 29 (2013), pp. 16075-16083.

Zhang, Yong et al., "Micro-Masonry of MEMS Sensors and Actuators," *Journal of Microelectromechanical Systems*, 23, 2 (Apr. 2014), pp. 308-314.

Jeong, Jae-Woong et al., "Two-axis MEMS scanner with transfer-printed high-reflectivity, broadband monolithic silicon photonic crystal mirrors," *Optics Express*, 21, 11 (Jun. 3, 2013), pp. 13800-13809.

Saeidpourazar, Reza et al., "A prototype printer for laser driven micro-transfer printing," *Journal of Manufacturing Processes*, 14 (2012), pp. 416-424.

Keum, Hohyun et al., "Silicon micro-masonry using elastomeric stamps for three-dimensional microfabrication," *Journal of Micromechanics and Microengineering*, 22 (2012) 055018 (7 pp).

Kim, Seok et al., "Enhanced adhesion with pedestal-shaped elastomeric stamps for transfer printing," *Applied Physics Letters*, 100 (2012), pp. 171909-1-171909-4.

Mengüç, Yiğit et al., "Gecko-Inspired Controllable Adhesive Structures Applied to Micromanipulation," *Advanced Functional Materials*, 22 (2012) pp. 1246-1254.

Berger, M., "Microfabrication Inspired by Lego," *NanoWerk* (2013) pp. 1-3.

Eisenhaure, J., "Microstructured Shape Memory Polymer Surfaces with Reversible Dry Adhesion," *ACS Appl. Mater. Interfaces* 5 (2013) pp. 7714-7717.

Eisenhaure, J. et al., "Microstructured Shape Memory Polymer Surfaces with Reversible Adhesion," Presentation from International Mechanical Engineering Conference & Exposition (IMECE) in Houston, TX, Nov. 13, 2012, pp. 1-15.

Eisenhaure, J. et al., "Microstructured Shape Memory Polymer Surfaces with Reversible Adhesion," Presentation from Materials Research Society (MRS) Fall Meeting in Boston, MA, Nov. 28, 2012, pp. 1-11.

Eisenhaure, J. et al., "Aphid Foot Inspired Reversible Dry Adhesives," Abstract from 2012 MRS Fall Meeting in Boston, MA, Nov. 28, 2012, 1 page.

Eisenhaure, J. et al., "Micro-Structured Shape Memory Polymer Based Stamps with Controllable Adhesion," Abstract from ASME 2012 International Mechanical Engineering Congress & Exposition (IMECE) in Houston, TX, Nov. 9-15, 2012, 1 page.

Kim, S. et al., "Microstructured Elastomeric Surfaces with Reversible Adhesion and Examples of Their Use in Deterministic Assembly by Transfer Printing," *PNAS*, 107, 40 (2010) pp. 17095-17100.

Kim, S. et al., "Reversible Dry Micro-Fibrillar Adhesives with Thermally Controllable Adhesion," *Soft Matter*, 5 (2009) pp. 3689-3693.

Liu, C. et al., "Review of Progress in Shape-Memory Polymers," *J. Mater. Chem.*, 17 (2007) pp. 1543-1558.

Volk, B., "Characterization of Shape Memory Polymers," NASA Langley Research Centre, Texas A&M University (2005) 11 pages.

\* cited by examiner

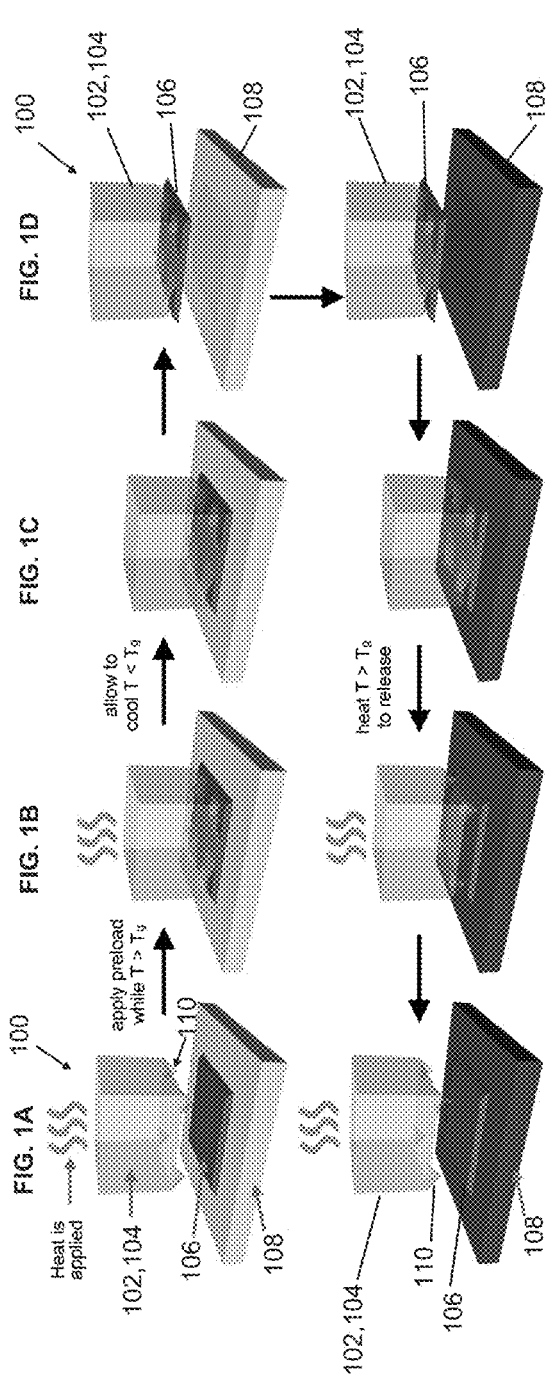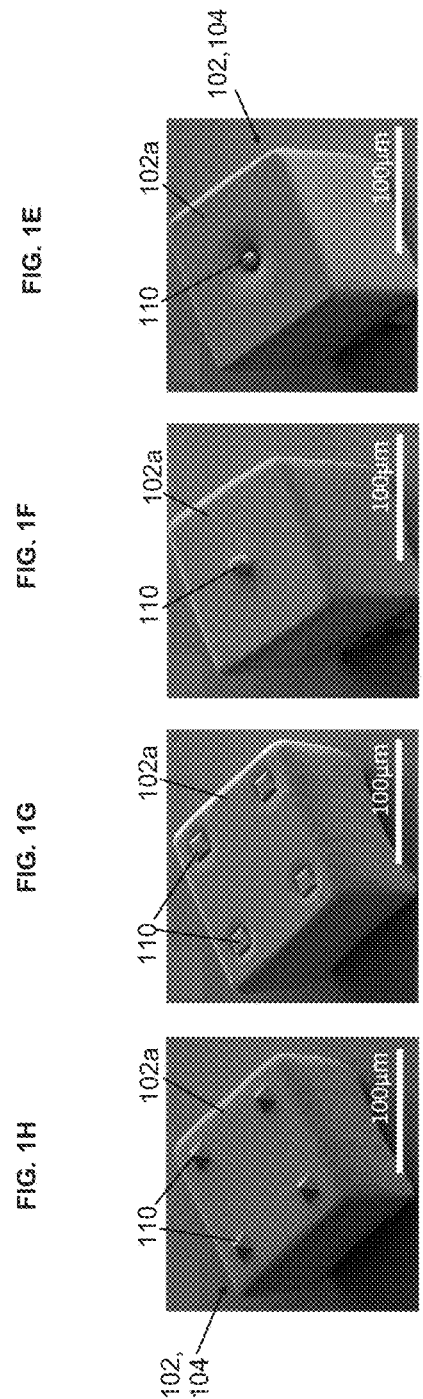

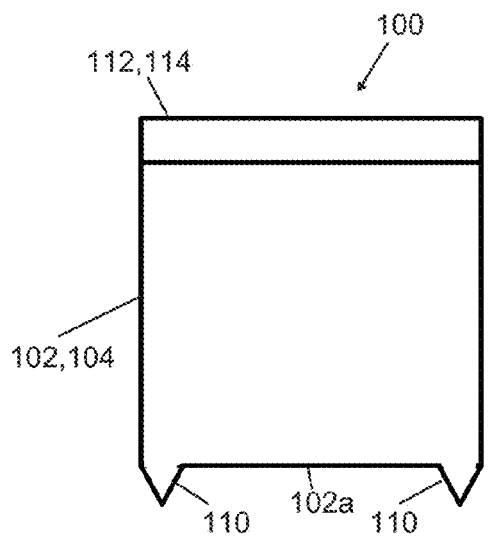
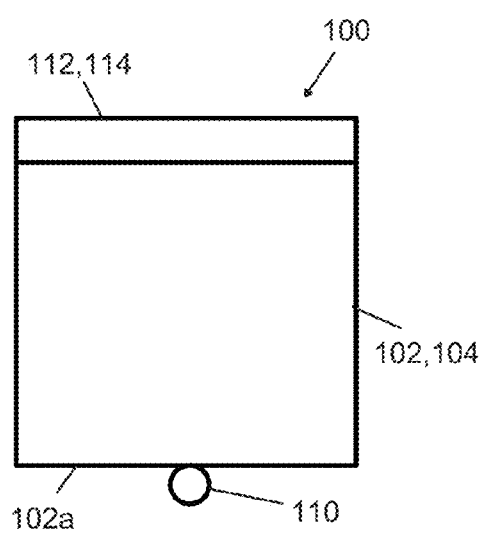
FIG. 3A
FIG. 3B
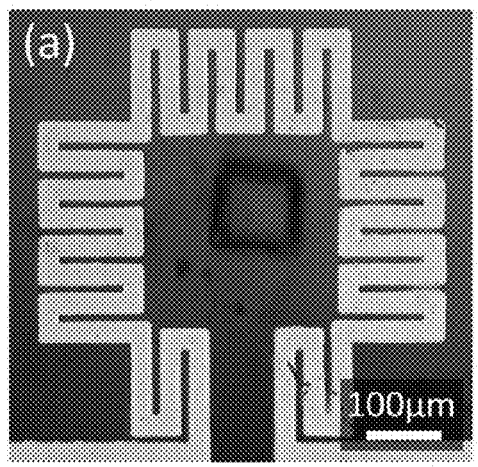
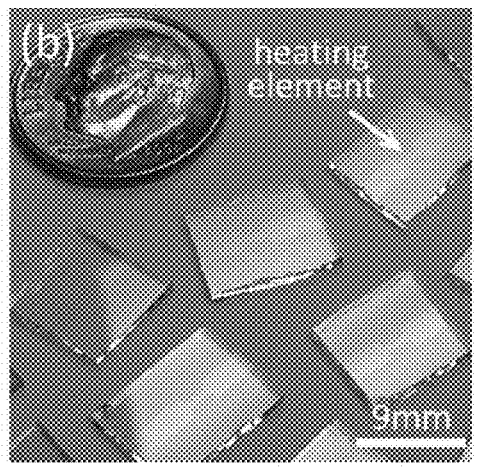
FIG. 4A
FIG. 4B

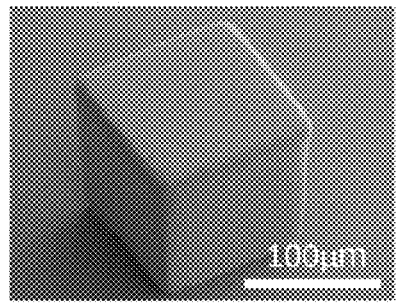
FIG. 5
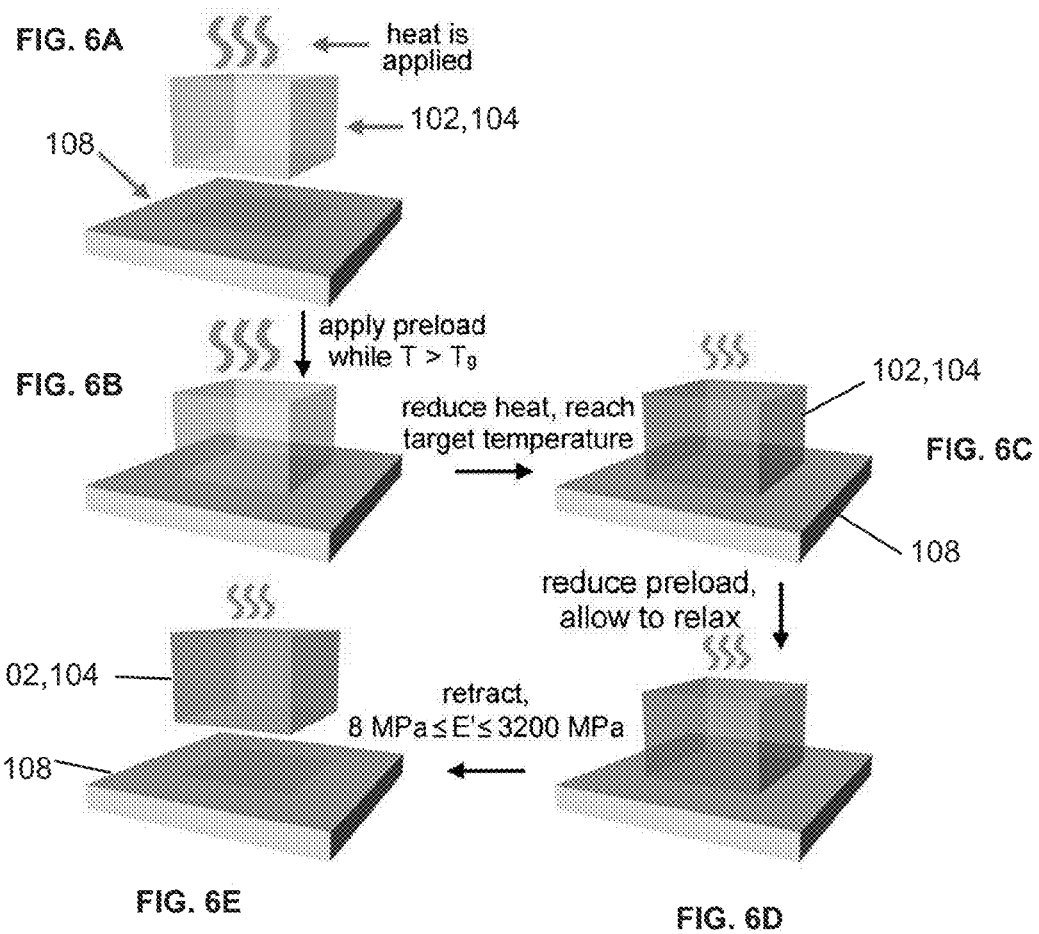

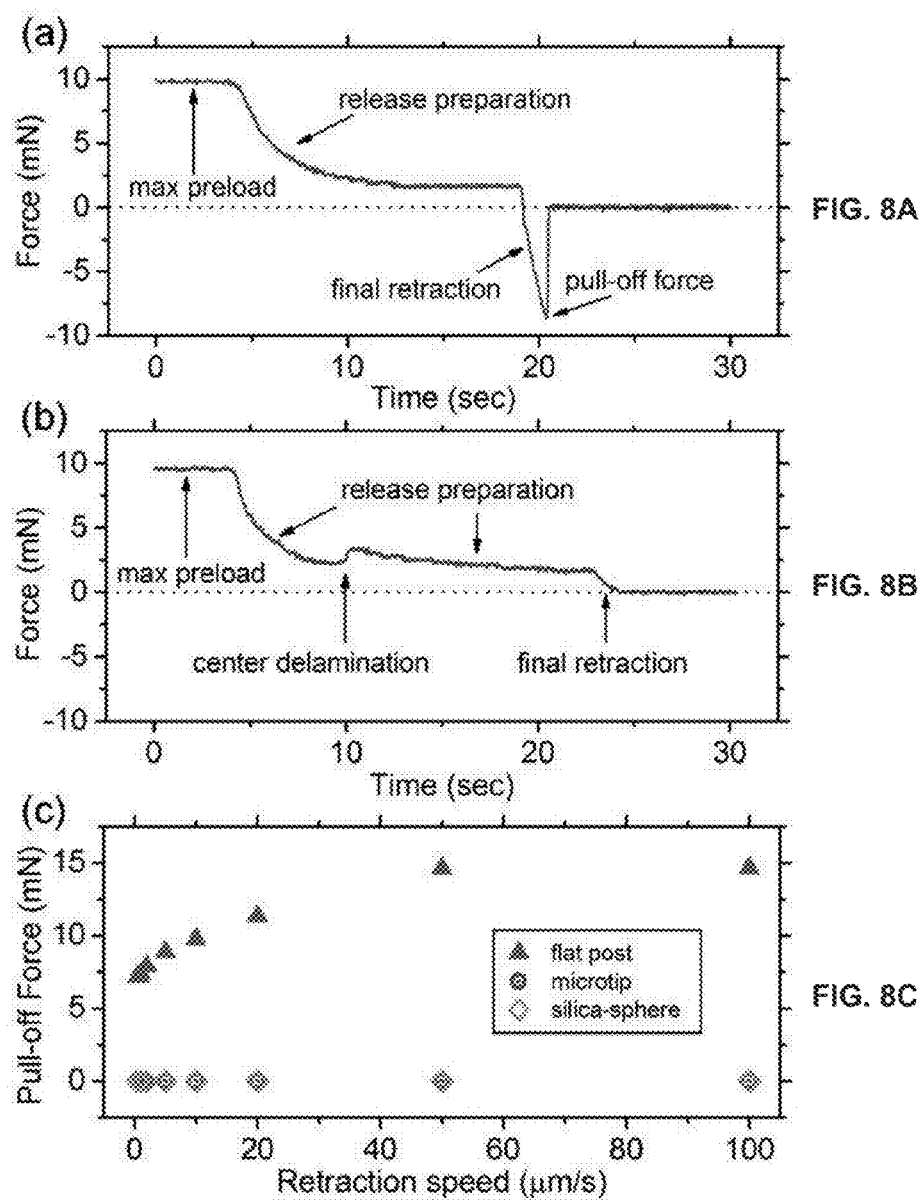

MICROSCALE STAMP WITH REVERSIBLE ADHESION FOR TRANSFER PRINTING

RELATED APPLICATIONS

The present patent document claims the benefit of priority under 35 U.S.C. § 119(e) to U.S. Provisional Patent Application No. 62/008,773, filed Jun. 6, 2014, and to U.S. Provisional Patent Application No. 62/039,743, filed Aug. 20, 2014, both of which are hereby incorporated by reference in their entirety.

TECHNICAL FIELD

The present disclosure is related generally to shape memory polymers and more particularly to microscale stamps comprising shape memory polymers with reversible adhesion for transfer printing.

BACKGROUND

Fabricating microsystems presents a set of challenges distinct from those that exist for manufacturing macroscale devices. Chief among these challenges is the difficulty of manipulating individual objects due to vanishing body forces compared with surface forces. Owing to these challenges, monolithic microfabrication, e.g., layer-by-layer in-situ fabrication of all components using electrochemical processes, is commonly used to fabricate microsystems. However, this approach has substantial drawbacks for the fabrication of non-planar structures, particularly when the integration of heterogeneous materials is desired. For example, complex and lengthy process steps to selectively and precisely deposit and etch materials without damaging those already in place may be required. Even with well-crafted recipes, such fabrication methods have severe limitations in terms of producible geometries and compositions.

Alternatively, pick-and-place microassembly techniques relying on probe tips or microgrippers are capable of assembling separately-fabricated components into microsystems with high flexibility and precision, representing an approach to constructing microsystems that cannot be produced with monolithic microfabrication. However, these approaches traditionally suffer from the difficulty of releasing a retrieved microcomponent on a target location, leading to the involvement of additional strategies including rolling, vibrating, mating, and relying on electrostatic interaction or tacky adhesives.

BRIEF SUMMARY

A microscale stamp for transfer printing includes (a) a stamp body comprising a shape memory polymer having a glass transition temperature ($T_g$) and (b) one or more protruding structures attached to a surface of the stamp body. The shape memory polymer comprises a deformable state at temperatures above $T_g$ and a rigid state at temperatures below $T_g$. The one or more protruding structures comprise a material which is different from the shape memory polymer and which has a Young's modulus greater than a storage modulus of the shape memory polymer. When the shape memory polymer is in the rigid state, the microscale stamp may comprise an adhesion capacity of at least about 0.1 MPa.

A microscale stamp for transfer printing includes (a) a stamp body comprising a shape memory polymer having a glass transition temperature ($T_g$) and (b) a resistive heating element attached to the stamp body for localized heating of the shape memory polymer. The shape memory polymer comprises a deformable state at temperatures above $T_g$ and a rigid state at temperatures below $T_g$. When the shape memory polymer is in the rigid state, the microscale stamp may comprise an adhesion capacity of at least about 0.1 MPa.

A method for microscale transfer printing includes locally heating a microscale stamp comprising a shape memory polymer to a temperature above a glass transition temperature ($T_g$) thereof. Prior to the localized heating, the shape memory polymer is in an initial configuration. A surface of the microscale stamp contacts an object to be transfer printed and a load is applied to the microscale stamp. The shape memory polymer deforms under the load to attain a deformed configuration having an increased contact area between the microscale stamp and the object. The microscale stamp is cooled to a temperature below the $T_g$, thereby increasing a rigidity of the shape memory polymer and stabilizing the deformed configuration. The microscale stamp is moved to a predetermined location while the temperature is maintained below $T_g$, and the object remains attached to the microscale stamp during the motion with an adhesion capacity of at least about 0.1 MPa. After arriving at the predetermined location, the microscale stamp is heated to a temperature above $T_g$ and the shape memory polymer returns to the initial configuration. The adhesion capacity of the microscale stamp consequently decreases and allows release of the object. The microscale stamp may then be retracted.

BRIEF DESCRIPTION OF THE DRAWINGS

FIGS. 1A-1H show schematically an exemplary transfer printing process utilizing an exemplary microscale stamp, which may alternately be referred to as a "microstamp."

FIGS. 2A-2B show scanning electron microscope (SEM) images of a microscale stamp that includes pyramidal microtips integrally formed with the stamp body, which comprises a shape memory polymer. In FIG. 2A the shape memory polymer is shown in an adhesion-off state and in FIG. 2B the shape memory polymer is shown in an adhesion-on state.

FIGS. 2C-2D show SEM images of a microscale stamp that includes a silica microsphere attached to the stamp body, which comprises a shape memory polymer. In FIG. 2C the stamp is shown in an adhesion-off state and in FIG. 2D, the stamp is shown in an adhesion-on state.

FIGS. 3A and 3B show cross-sectional schematics of exemplary microstamps each including an attached microscale heating element for localized heating of the stamp body.

FIGS. 4A and 4B are photographs showing images of exemplary heating elements formed from a nickel-chromium alloy and indium-tin oxide (ITO), respectively.

FIG. 5 shows an SEM image of 100 μm×100 μm flat microscale stamp that includes no protruding structures.

FIGS. 6A-6E illustrate steps in an adhesion test for a flat microstamp.

FIGS. 8A-8B show measured-force versus time curves for a flat post microstamp and a microstamp including integrally formed microtips, respectively.

FIG. 8C shows pull-off force versus retraction speed for three exemplary stamp designs. Tests are performed while the microstamps are heated above $T_g$ ("adhesion off"), and show the improved release characteristics of the microtip and silica-sphere stamps compared to the flat post stamps.

DETAILED DESCRIPTION

Figure 7A:
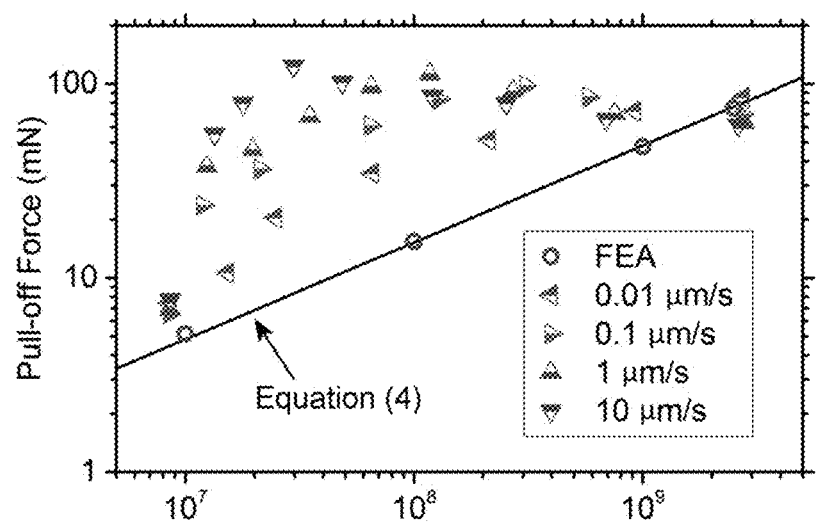
FIG. 7A shows pull-off force versus storage modulus for the flat post microstamp of FIG. 5 at various retraction speeds, where the analytical solution of Equation (1) and linear elastic finite element results are compared.

Described herein is a microscale stamp with reversible adhesion for transfer printing. The microscale stamp utilizes a shape memory polymer to achieve deterministic assembly of microscale objects. A polymer exhibiting the shape memory effect may be readily deformed above its glass transition temperature, increase in rigidity and retain the deformed configuration upon cooling below the glass transition temperature, and then, upon reheating above the glass transition temperature, recover its initial, undeformed configuration. The dynamic rigidity control afforded by heating or cooling a shape memory polymer across its glass transition temperature allows the adhesion properties of the microscale stamp to be manipulated during transfer printing, as described below. Furthermore, the shape-fixing and recovery property of the shape memory polymer enables substantial freedom in stamp design, such as the inclusion of surface texturing and/or heterogeneous surface features to minimize adhesion during release. Exemplary devices that may be assembled by this transfer printing technology include a micro-motor structure with a movable rotor, as described below.

The transfer printing process utilizes a microscale stamp 100 having a stamp body 102 comprising a shape memory polymer 104, as shown for example in FIGS. 1A-1H, 2A-2D and 3A-3B. The shape memory polymer 104 comprises a deformable state above a glass transition temperature ($T_g$) thereof and a rigid state below the $T_g$. The change in storage modulus (or rigidity) of the shape memory polymer between the rigid state and the deformable state is at least about 10:1, and is more typically at least about 30:1, or at least about 100:1. The glass transition temperature $T_g$ may encompass a single temperature or, more typically, a range of temperatures. Thus, the glass transition temperature $T_g$ may alternately be referred to as a glass transition temperature zone $T_g$.

The glass transition temperature $T_g$ identifies a critical temperature (or temperature range) where the free volume around polymer chains is sufficient to allow them to undergo short-range slippage. When this occurs, the polymer becomes more compliant and therefore more easily deformable. Imposed deformation in this state decreases the entropy within the polymer network, but maintains the long-range polymer chain structure. Cooling the polymer while under the imposed deformation effectively traps the polymer chains in their as-deformed configuration, a process sometimes referred to as shape fixing. The initial, undeformed configuration may be recovered by heating the polymer again above its $T_g$ in a process that may be referred to as shape recovery.

FIGS. 1A-1H show an exemplary transfer printing process. Prior to transfer printing, the shape memory polymer 104 (and thus the stamp body 102) may be in an initial, undeformed configuration that may be referred to as an "adhesion-off" configuration or state. In FIG. 1A, the shape memory polymer 104 is heated to a temperature above the $T_g$, and a surface 102a of the stamp body 102 is brought into contact with an object 106 to be transfer printed, as illustrated in FIG. 1B. (The surface 102a of the stamp body 102 can be seen in FIGS. 2A-2D.) Preferably, the heating of the shape memory polymer 104 is localized heating that may be carried out by a local heat source, as described further below in reference to FIGS. 3A-3B and 4A-4B. A load is applied to the microscale stamp 100 during the heating. The shape memory polymer 104 deforms in response to the load, attaining a deformed configuration with an increased contact area between the microscale stamp 102 and the object 106 in comparison with the initial configuration. The stamp body 102 is then cooled to a temperature below the $T_g$ to increase the rigidity of the shape memory polymer 104 and effectively "lock in" or stabilize the deformed configuration, creating an "adhesion-on" configuration, as shown in FIG. 1C.

The applied load is removed or reduced and the microscale stamp 100 is moved (e.g., translated, rotated) along with the object 106 (which is attached to the stamp body 102) to a predetermined location, as illustrated in FIGS. 1D-1F. The transfer printing process may include lift, transport, and/or placement steps to move the object 106 from a first location to a second location. The microscale stamp 100 may be attached to a computer-controlled micropositioner for implementing the translational and/or rotational motion of the stamp 100. The object 106 remains attached to the microscale stamp 100 with an adhesion capacity of at least about 0.1 MPa while the temperature of the stamp body 102 is kept below $T_g$ (i.e., while the shape memory polymer 104 is in the rigid state). In some cases, the adhesion capacity may be at least about 1 MPa, or at least about 3 MPa, while the stamp body 102 is kept below $T_g$. The adhesion capacity may also be as high as about 5 MPa. The adhesion capacity referred to here may be understood to be the adhesion capacity of the microscale stamp with respect to a silicon object at temperatures below $T_g$. However, as would be recognized by one of ordinary skill in the art, the transfer process is not limited to silicon objects; indeed, the object may comprise any of a number of materials, such as a polymer, metal, alloy, ceramic, or semiconductor.

After arriving at the predetermined location, the stamp body 102 is heated again to a temperature above $T_g$, and the shape memory polymer 104 loses rigidity and recovers the initial, adhesion-off configuration, as shown in FIG. 1G. As this occurs, the contact area between the stamp 102 and the object 106 decreases, and the adhesion capacity drops to allow release of the object 106, enabling positioning on a substrate 108. The microscale stamp 100 may then be retracted, as shown in FIG. 1H.

The method may be carried out with any embodiment of the microscale stamp 100 described herein.

As indicated above, the microscale stamp 100 includes a stamp body 102 comprising a shape memory polymer 104 that has a deformable state at temperatures above the $T_g$ and a rigid state at temperatures below the $T_g$. When the shape memory polymer 104 is in the rigid state, the microscale stamp 100 may exhibit an adhesion capacity of at least about 3 MPa. According to one embodiment, and as shown in FIGS. 2A-2D, one or more protruding structures 110 may be attached to or integrally formed with a surface 102a of the stamp body 102 to facilitate easy release of an object 106 being manipulated.

The one or more protruding structures 110 may comprise a material (e.g., a ceramic, metal, or alloy) different from the shape memory polymer 104. The material may have a high stiffness, which can reduce the adhesion force or "stickiness" of the stamp when the object 106 is about to be released. For example, the Young's modulus of the material may be higher than a storage modulus of the shape memory polymer, where the storage modulus referred to here may be the storage modulus of the shape memory polymer in the deformable state. The Young's modulus may also be higher than the storage modulus of the shape memory polymer in the rigid state. The Young's modulus of the material may be at least about 60 GPa, at least about 100 GPa, or at least about 200 GPa. Exemplary materials include alumina, silica, zirconia, yttria, silicon nitride, aluminum nitride, silicon carbide, and/or stainless steel. FIGS. 2C and 2D are images of an SMP stamp with an attached silica sphere in the adhesion-off and adhesion-on states of the microscale stamp, respectively. The silica sphere is rigid and relatively rough on the submicron level, resulting in extremely low adhesion to the object during the final separation step of printing.

The shape memory polymer of the stamp body may be understood to be a polymer that undergoes a large change in rigidity and a strong shape memory effect over a well-defined glass transition temperature range. The change in storage modulus (or rigidity) for some shape memory polymers can be substantial, exceeding, in some cases, a 100:1 ratio below and above $T_g$, respectively. As discussed above, the change in storage modulus (or rigidity) of the shape memory polymer between the rigid state and the deformable state may be at least about 10:1, and is more typically at least about 30:1. Among the advantages of using a shape memory polymer for the stamp body is the high maximum adhesion possible by performing pickup while the polymer is in the rigid state at temperatures below $T_g$. In addition, the control over adhesion is substantially time-independent since the rigidity and shape of the shape memory polymer are determined by temperature. Suitable shape memory polymers may be based on epoxy, polyurethane, and/or (poly)ethylene-co-vinyl acetate (EVA), such as NGDE2, which can be fabricated as described below. The shape memory polymer may have a $T_g$ in the range of from about 0° C. to about 300° C., although more typically the $T_g$ is above room temperature. For example, the $T_g$ may be from about 30° C. to 70° C., or from about 40° C. to 60° C.

The microscale stamp has a size suitable for the manipulation of micro- and milli-scale objects. Advantageously, the surface of the stamp body may have an area of from about 1 square micron to about 1 square millimeter, and the area is more typically in the range of from about 1 square micron to about 0.1 square millimeter. The area referred to here is a planar or a two-dimensional area of the surface of the stamp body.

To promote strong adhesion during transfer printing, the microscale stamp is designed to contact the object of interest over a large contact area when the stamp body is in the adhesion-on state. Similarly, to facilitate release of the object after transfer printing, the microscale stamp is designed to contact the object at no more than a few small contact points once the shape memory polymer has returned to its initial, adhesion-off state. Accordingly, the one or more protruding structures may have a total contact area with the object of interest of no more than about 25% of the area of the surface of the microscale stamp. The total contact area may also be no more than about 20% of the area, no more than about 15% of the area, no more than about 10% of the area, or no more than 5% of the area of the surface. Typically, the total contact area of the one or more protruding structures is at least about 1% of the area of the surface. Due to the high stiffness of the protruding structure(s), the total contact area of the protruding structure(s) with the object may not change substantially during transfer printing.

The one or more protruding structures may be spherical, pyramidal or irregular in shape. In some cases, the one or more protruding structures may include some amount of surface roughness. For example, the protruding structure(s) may exhibit a submicron-scale surface roughness (e.g., an average surface roughness of about 100 nm-800 nm). Such features may be beneficial in reducing the total contact area of the protruding structure(s) with the object being manipulated in order to promote ease of release.

The one or more protruding structures may have an average linear size of at least about 100 nm, at least about 1 micron, or at least about 10 microns, and typically the average size is not larger than about 100 microns, or not larger than about 50 microns. For example, the one or more protruding structures may have an average linear size (e.g., average diameter or average width) of about 15 microns to about 25 microns.

The microscale stamp 100 may further comprise a resistive heating element 112 attached to the microscale stamp body 102 and configured for connection to a current source, as shown for example in the schematics of FIGS. 3A and 3B. During transfer printing, the resistive heating element 112 may serve as a localized heat source for heating the shape memory polymer 104 without substantially changing the temperature of the surrounding environment, the object 106 being transfer printed, and/or the substrate 108 that supports the object. Current may be flowed through the resistive heating 112 element to locally heat the shape memory polymer 104 and the current flow may be halted for passive cooling of the shape memory polymer 104. The resistive heating element 112 may take the form of an electrically conductive thin film 114, which may be patterned (e.g., using photolithography and etching methods known in the art) to have a particular geometry, such as the serpentine pattern shown in FIG. 4A. The electrically conductive thin film 114 may have a thickness of from about 100 nm to about 500 nm in some embodiments.

The resistive heating element may be attached to or embedded within the shape memory polymer. The resistive heating element may comprise any of a number of conductive materials, including metals, alloys, carbon and/or conductive oxides. Three exemplary resistive heating elements, one comprising a nickel-chromium alloy, one comprising indium-tin oxide (ITO), and another comprising a conductive polymer composite, are described in greater detail below. Depending on the material used for fabrication, the resistive heating element may be optically transparent, such as when ITO is employed to form the electrically conductive thin film. The resistive heating element may be disposed between a backing layer (e.g., a glass backing layer) and the stamp body.

Due to the small size of the stamp, the heating and cooling may be effected very rapidly with the microscale heating element. The thermal response time of a system is proportional to the square of the length scale, by inspection of the Fourier number. By shrinking the heating element and heated region to a scale comparable to the size of the microstamp, the response time may be reduced to the order of 5 seconds or less, or 1 second or less. For example, heating the shape memory polymer to a temperature above $T_g$ from room temperature may occur over a timespan of a few milliseconds up to one second. The resistive heating element may span an area of from about 1 square micron to about 10 square millimeters, from about 1 square micron to about 1 square millimeter, or from about 1 square micron to about 0.1 square millimeter. The reduced size of the heated region can greatly reduce the total thermal expansion of the system, which can eliminate the need for active control of stamp position during cooling.

Thus, a microscale stamp for transfer printing may include a stamp body comprising a shape memory polymer having a glass transformation temperature $T_g$, where the shape memory polymer comprises a deformable state at temperatures at or above $T_g$ and a rigid state at temperatures below $T_g$, as above. A resistive heating element may be attached to the stamp body, as shown in FIG. 3A. When the shape memory polymer is in the rigid state, the stamp comprises an adhesion capacity of at least about 0.1 MPa, and in some cases higher (e.g., at least about 1 MPa, or at least about 3 MPa). The microscale stamp may further comprise one or more protruding structures attached to a surface of the stamp body, as shown in FIG. 3B. As described above, the one or more protruding structures may comprise a material different from the shape memory polymer and having a Young's modulus of at least about 60 GPa. The microscale stamp of this embodiment may further include any of the features described elsewhere in this disclosure for the stamp body, resistive heating element, and/or the one or more protruding structures.

EXAMPLES

Adhesion Testing of Exemplary Flat and Textured Stamps

To demonstrate the adhesion capability of a stamp comprising a shape memory polymer (SMP), a SMP stamp with a flat surface as shown in FIG. 5 is considered first. In these examples, the SMP employed is known as NGDE2, a thermoset SMP previously developed and described by T. Xie and I. A. Rousseau, "Facile tailoring of thermal transition temperatures of epoxy shape memory polymers," Polymer, vol. 50, no. 8, pp. 1852-1856, April 2009. This formulation was chosen due to its desirable properties, such as high shape fixity and recovery factors, large rigidity change near $T_g$, convenient and narrow $T_g$ range (40° C. to 60° C.), and optical transparency. The adhesion between the SMP stamp and a silicon substrate is measured using test procedures similar to those used previously for PDMS stamps.

To fully exploit the shape-memory properties of the stamp, the retraction step occurs at a temperature below the glass transition zone, which corresponds to a stamp rigidity greater than 3 GPa when the temperature is below $T_g$ (e.g., 40° C. in this example). However, in order to investigate the role of the stamp's rigidity on its adhesive performance, the SMP stamp is tested at intermediate temperatures within its glass transition zone. The essential steps of the testing procedure are illustrated in FIGS. 6A-6E, showing how a bond is formed and adhesion is tested for SMP stamps at varied retraction temperatures, and thus at varying values of stamp rigidity or storage modulus.

As an approximation to predict the effect of stamp rigidity on adhesive performance, linear elastic fracture theory which does not take polymeric viscoelasticity into account is employed. The energy release rate G for a propagating crack in a homogeneous isotropic material for plain stress conditions is given as $$G = \frac{K_I^2}{E} \tag{1}$$

where $K_I$ is the mode-I stress intensity factor and E is the material's elastic modulus, for which storage modulus may be substituted for analysis of SMP. In the case of fracture between the stamp-substrate interface, the mismatch between the elastic moduli of the two materials can be accounted for. The effect of the mismatch on energy release rate has been previously investigated, and recognizing that the elastic modulus of SMP is very small compared with that of the silicon substrate, it is sufficient to treat the bimaterial interface as a homogeneous interface with double the elastic modulus of the SMP. In this case, the energy release rate becomes $$G = \frac{K_I^2}{2E_{SMP}} \tag{2}$$

The mode-I stress intensity factor for an edge crack of length a in a semi-infinite material subject to an evenly distributed stress σ is given by $$K_I = 1.1215 \sigma \sqrt{\pi a} \tag{3}$$

To derive the expected pull-off force, it is assumed that the crack will begin to propagate when the energy release rate reaches the SMP-substrate work of adhesion $\gamma_o$. It is further assumed that an initial crack length of 1 μm exists at the edge of the interface, giving an a/L ratio of 0.01 for the square stamps of 100 μm width under investigation, where L is the width of the stamp. Then inserting Equation 3 into Equation 2 and rearranging, recognizing that $\sigma = F/A = F/L^2$, yields $$F_{pulloff} = \sqrt{25.31 \gamma_o (2E_{SMP}) L^3} \tag{4}$$

Equation (4) is plotted in FIG. 7A for a SMP-silicon work of adhesion estimated to be 46 mJ/m². An Abaqus finite element analysis (FEA) was performed using analogous assumptions as an additional check for the validity of the analytical solution. The axisymmetric model evaluates the energy release rate as a function of the uniformly distributed stress, applied on the substrate normal to the interface, using the J-integral method. A fixed boundary condition is used to restrict the stamp end displacement. The uniform stress at which the energy release rate reaches the work of adhesion of the stamp-substrate interface is considered to be the critical stress required to delaminate the stamp. The force corresponding to this critical stress is evaluated for several values of stamp rigidity. The results are plotted in FIG. 7A to compare with Equation 4.

Adhesion data are collected for a range of temperatures and retraction speeds using a 100 μm×100 μm flat SMP stamp. When compared to the linear elasticity-based analysis, the adhesion data show much more complex behavior. The adhesive strength of the interface appears to be highly dependent upon retraction speed, indicating a strong viscoelastic effect within the glass transition zone. The adhesive strength of polymers may be more thoroughly described by accounting for viscoelasticity using an equation of the form:

$$\gamma_{eff}(v,T)=\gamma_0[1+f(v,T)] \quad (5)$$

Where $\gamma_{eff}$ is the amount of energy required to advance the crack tip by one unit area, $\gamma_o$ is the energy required to break the interfacial polymer-substrate bonds at extremely low crack velocities, and f(v, T) describes the bulk viscoelastic energy dissipation in front of the crack tip as a function of crack tip velocity and temperature. The viscoelastic dissipation term vanishes as crack tip velocity approaches zero.

The collected adhesion data in FIG. 7A are in agreement with this expectation, with adhesion increasing as retraction velocity is increased. The effect of velocity is greatest near to the "center" of the glass transition zone where the loss modulus, a measure of viscous dissipation within the polymer, reaches a maximum. At the tail ends of the glass transition region, where the loss modulus is very small compared with the elastic modulus, the adhesion is relatively unaffected by retraction velocity. As the retraction speed is reduced, the adhesion approaches the linear elastic result predicted by Equation 4 due to the diminishing contribution from viscous dissipation. Since typical operation of the SMP stamp requires that pickup/print events occur at the tail ends of the glass transition zone to take advantage of the shape memory effect, the stamps are, in practice, relatively insensitive to the retraction speed. Since work of adhesion for polymers is not significantly affected by small temperature variations, it is concluded that the primary factor affecting the change in adhesion between the hot ($T>T_g$) and cold ($T<T_g$) states of the SMP stamps is the change in storage modulus. The SMP at room temperature is three orders of magnitude more rigid than PDMS, corresponding to a factor of 30 expected increase in maximum adhesion, assuming similar surface energies. Accordingly, these experimental results show that the cold-state adhesion for the flat SMP stamp is in excess of 5 MPa (50 mN for 100 μm×100 μm stamp), which compares with 0.15 MPa previously demonstrated for a flat PDMS stamp.

The benefits afforded by the time insensitive nature of the SMP's shape recovery become apparent when one considers textured microstructured stamp designs that have well defined "adhesion-on" and "adhesion-off" states, due at least in part due to the presence of one or more protruding features for contacting and releasing the object. The textured microstructured stamp shown in FIGS. 2A-2B includes microtips (the "protruding features") integrally formed with the stamp body. Alternative stamp designs may incorporate heterogeneous materials, such as the silica microbead shown in FIGS. 2C-2D, as the protruding feature(s). In these microscale stamp examples, the microtips are pyramidal in shape and the microbeads are spherical, although other shapes of the protruding features are possible for either stamp (e.g., spheres, bumps, pyramids, etc.).

The object-release performance of SMP stamps including either microtips or silica-sphere(s) as the protruding features is compared to the object-release performance of a flat stamp ("flat post stamp"). FIGS. 8A-8B show typical force versus time behavior during the tests for the flat post and microtip stamps, respectively. The plots begin with a relatively large 10 mN preload to fully compress the stamps to make full contact with the substrate surface, followed by a release preparation step where the preload is reduced to approximately 1.5 mN. This step is included to ensure that the adhesion data for the textured stamps represents the intrinsic adhesion-off values. The net adhesion during retraction, referred to as the pull-off force, is measured by retracting the stamps while heated from the substrate from this low-preload state at various retraction speeds, as shown in FIG. 8C. The flat post stamp demonstrates a modest increase in pull-off force with increasing retraction speed, characteristic of viscoelastic polymer stamps, including PDMS. The textured stamps show adhesion values below the noise threshold of the load cells (<0.2 mN), and thus are taken to be nearly zero at all velocities. This result demonstrates their suitability for transfer printing. The substantial improvement in adhesion-off performance is achieved with only a small penalty to adhesion-on performance. Experimental results show that the textured SMP stamp designs maintain at least about 80% of the "adhesion on" strength of a comparably sized flat-post stamp, roughly corresponding to the reduction in adhesive area caused by the surface relief features.

TABLE 1

Comparison of adhesive strength and reversibility for flat versus microtip stamp designs

| Material | Stamp Surface Geometry | Max Adhesion (kPa) | Reversibility (max:min) | Adhesion Control Method |
| --- | --- | --- | --- | --- |
| Exemplary microstamp designs | flat microtip | 3200 2800 | 6:1 >1000:1 | rigidity change rigidity & contact area change |

Exemplary Heating Elements for Localized Heating

The heat source to trigger thermal transition in the SMP may take many forms. Macroscale (e.g., centimeter-scale) resistive heaters may be used to bring the substrate, stamp, and surroundings to an isothermal state, as was done to collect the adhesion data described above. There are two significant drawbacks to using a heat source of this size. Thermal cycle time is prohibitively long, and thermal expansion of materials above and below the stamp during the cooling phase of the bonding process means active displacement control of the stamp may be necessary to maintain the proper preload and assure a proper bond is made. Both of these difficulties can be effectively eliminated by using a more localized heat source.

Three such resistive heaters are described here. One heater is made of a nickel-chromium (NiCr) alloy (FIG. 4A), another from transparent ITO (FIG. 4B), and a third is made from a conductive polymer composite comprising carbon particles dispersed in a shape memory polymer.

The NiCr heater exhibits a particularly rapid thermal response time due to its small size. Shape recovery in the stamp following deformation occurs nearly instantaneously (<1 second) upon application of power to the heater. Cooling occurs on the same time scale. The use of NiCr may necessitate a "window" design, as shown in FIG. 4A, where the heater wraps around the periphery of the stamp to allow visibility of the stamp during the printing process. (Such visibility may not be required for computer-controlled transfer printing processes.)

The heater shown in FIG. 4B includes ITO as a transparent, conductive layer. ITO is more resistive than NiCr, and therefore an appropriate resistance may be achieved using a simple straight band design. The band design provides a relatively large area of uniform heating over which the stamp may be placed, where modest variations in position result in negligible changes in stamp temperature. The ITO layer has greater than 90% visible light transmittance, allowing for a clear view of the printing process, if needed.

Another exemplary resistive heating element design comprises an electrically conductive polymer composite that includes carbon particles dispersed in a shape memory polymer, such as the NGDE2 formulation used throughout the Examples. Typically, the composite includes from about 5 wt. % carbon (e.g., carbon black particles) to about 40 wt. % carbon. The composite may be produced as a strip having a thickness of from about 50 microns to about 500 microns, which may be attached to the stamp body as illustrated in FIGS. 3A-3B.

Transfer Printing Examples with Localized SMP Heating

Figures 9A, 9B, 9C:
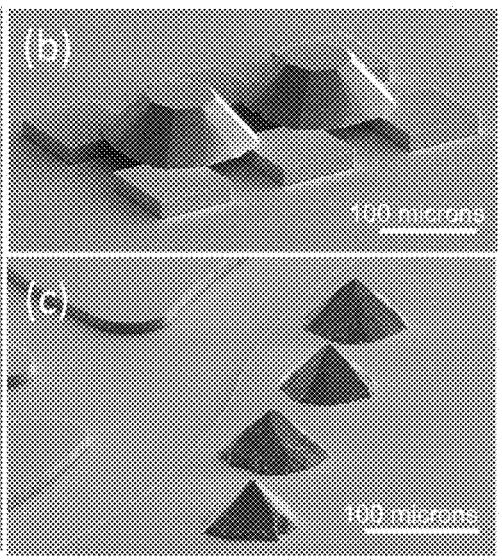
FIGS. 9A-9C show SEM images of conical silicon objects after transfer printing using a microstamp to form various arrangements.

The resistive heating elements shown in FIGS. 4A and 4B were used in conjunction with textured SMP stamp designs to fabricate the three silicon microstructures shown in FIGS. 9A-9C. Lifting three-dimensional objects (referred to here as "inks"), in particular the conical inks of this example, requires relatively large adhesion at the stamp-ink interface due to the relatively small top surface compared with the base of the ink which is anchored to the substrate prior to pickup. Placing the inks stacked vertically to form a miniature pagoda shown in FIG. 9A demonstrates the minimization of adhesion during printing, and also the ability to maintain precise alignment for deterministic assembly. Placing the inks suspended on previously-printed square inks, as in FIG. 9B, again demonstrates the ability to reduce the stamp-ink interfacial adhesion to very low levels as previously described. Small, sharp conical inks are particularly difficult to lift with common elastomeric stamps due to the high strains necessary to conform to its surface causing immediate delamination upon retraction. However, using the shape-fixing ability of an SMP stamp it is possible to freeze the stamp in its deformed shape during pickup and thus lift the ink. The ink may then be kept in an upright position during transport to the receiving substrate, thus making alignment a relatively simple and repeatable task. In FIG. 9C, four such inks are aligned along the edge of an etched silicon riverbed, creating a miniature silicon mountain range.

Figures 10A, 10B, 10C:
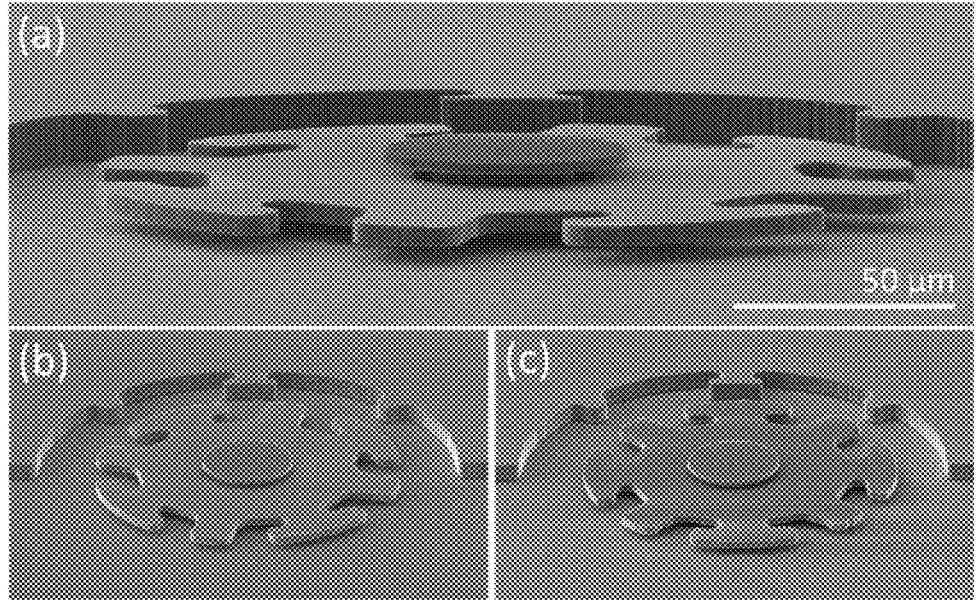
FIGS. 10A-10C show SEM images of a micro-motor representation assembled from prefabricated components using a microstamp. The freedom of the rotor to rotate by external manipulation can be seen by comparing FIG. 10B with FIG. 10C.

A representation of a micro-motor is assembled as shown in FIGS. 10A-10C. The micro-motor includes three separately fabricated and assembled silicon features: a substrate consisting of a stator and a rotor-axle, a rotor, and a cap printed on the end of the rotor-axle to hold the printed rotor in place. The simplified stator design does not allow the motor's actuation by electrostatic force, but its freedom to rotate about its axle is maintained as demonstrated using manual manipulation in FIGS. 10B and 10C. This is accomplished using small rounded protrusions (not pictured) beneath the rotor to minimize contact with the substrate, similar to many micro-motor designs created using traditional microfabrication. The cap is bonded to the axle using thermal annealing, while the aforementioned protrusions minimize rotor-substrate contact area adequately to prevent bonding of the two.

Fabrication and Test Details

SMP Stamp Material:

The epoxy-based SMP used for the above examples is created from a 1:1:1 molar ratio of EPON 826 (The diglycidyl ether of bisphenol A epoxy monomer; Momentive), Jeffamine D230 (poly(propylene glycol)bis(2-aminopropyl) ether; Huntsman), and NGDE (Neopentyl glycol diglycidyl ether; TCI America). Prior to mixing, the EPON 826 is heated at 60° C. for 30 minutes to remove any crystallization. The glass transition zone spans 40° C.-60° C.

Fabrication of SMP Stamps:

Molds for the SMP stamps are fabricated using SU-8 on silicon wafers using established methods. The SMP stamps are fabricated on glass substrates by a double molding process utilizing PDMS (Slyguard 184 silicone elastomer kit). First, the SU-8 molds are treated with a non-stick layer (tridecafluoro-1,1,2,2-tetrahydrooctyltrichlorosilane; Sigma-Aldrich) by vapor deposition to facilitate mold release. PDMS is mixed in a 10:1 monomer to curing agent ratio and cured in the SU-8 molds at 100° C. for 30 minutes. The resulting PDMS stamps are then etched in an oxygen plasma for 15 seconds in a reactive ion etcher at 100 W to facilitate the bonding of a fluorinated non-stick layer, resulting in a low surface energy positive molds. These positive molds are used to make negative PDMS molds, again created with a 10:1 monomer to curing agent ratio and cured at 100° C. for 30 minutes. The resulting negative molds are then filled with a small volume of SMP precursor and pressed against a glass substrate for curing. When cured for use with a microscale heater, the mold cavity is aligned over the heater prior to curing at 100° C. for 90 minutes. Silica spheres are manually placed on flat-post stamps using precision stages. A small droplet of SMP precursor is first placed on an SMP flat-post stamp. Surface tension from the droplet is then used to pick and hold a single sphere prior to curing at 100° C. for 90 minutes.

Fabrication of Microheaters:

The NiCr heater is fabricated by sputtering a 250 nm layer of NiCr on a glass substrate patterned with AZ 5214 photoresist, then lifting off excess NiCr by dissolving the photoresist in acetone under sonication. The final heater has a serpentine pattern of NiCr with approximately 1000Ω resistance which heats the central stamp region to approximately 100° C. with 200 mW of power. Stamps are fabricated on the surface of the heater substrate using a PDMS negative mold. The mold is filled with SMP precursor, then pressed against the heater substrate and the stamp cavity aligned with the heater prior to curing. A thin layer of SMP approximately 50 μm coating the heater substrate results, with the stamp situated within the central opening in the heater as depicted in FIG. 4A.

The ITO heater is fabricated by patterning AZ 5214 on an ITO-coated glass substrate, then etching the ITO with an 18% hydrochloric acid solution. The stamps are fabricated above the narrow central region of the ITO pattern in a manner similar to that described for the NiCr heaters. Due to its larger size compared with the NiCr heaters, this particular ITO design requires approximately 400 mW to achieve a similar temperature, and possesses a thermal response time on the order of 1 second.

Figure 7B:
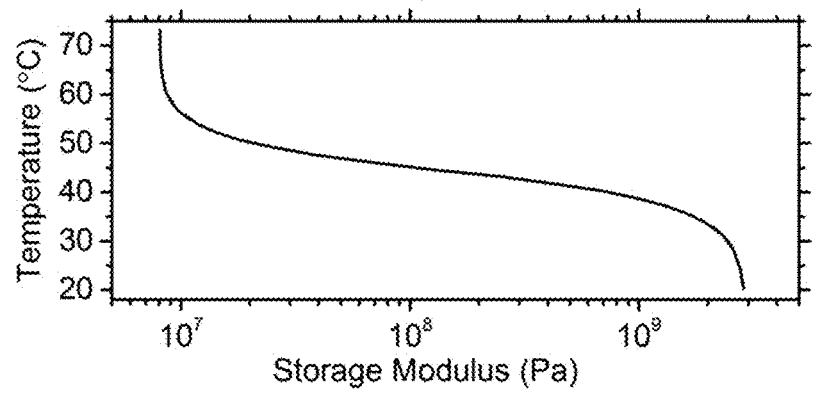
FIG. 7B shows the temperature corresponding to each value of storage modulus, spanning the shape memory polymer glass transition zone.

Adhesion Tests for SMP Stamps:

To test the adhesion of the SMP stamps, the SMP stamps are mounted on precision translational and rotational stages. A small load cell (Transducer Techniques, GSO-25) is mounted below the stamp to measure the force between the stamp and the mating silicon substrate. The silicon substrate is placed atop a small (~0.5 cm$^3$) resistive heater mounted to the load cell to ensure consistent heating between the different stamps. To test the hot-state adhesion, the substrate surface is heated for approximately 3 minutes to attain a steady state temperature of 90° C. A custom program was written to control the movement of the stages to maintain a set preload. Using this program, the stamp is brought into contact with a preload of 10 mN. After one minute, the preload is reduced to 1.5 mN, and five seconds after achieving this reduced preload, the stamp and substrate are separated at varying speeds to generate adhesion data. To test adhesion as a function of storage modulus, the temperature of the stamp/substrate interface is monitored and the storage modulus is inferred from temperature based on material property data. After the bonding period at 90° C., the heater power is reduced to achieve the desired steady state temperature. Once this temperature is reached, the preload is reduced to 1.5 mN for five seconds, followed by separation at the various speeds shown in FIG. 7. To test the cold-state adhesion, the substrate is similarly heated, and after one minute of being held at 10 mN preload, power to the heater is shut off. Three minutes are allowed to elapse to ensure adequate cooling of the stamp below its $T_g$, and then the stamp is retracted at 5 μm s$^{-1}$.

Assembly of Silicon Inks (3D Silicon Objects):

An SMP microtip stamp heated by a thin-film NiCr resistive or a indium tin oxide (ITO) heater is used for retrieval and release of each silicon ink. Retrieval of a silicon ink is performed directly from a donor substrate and release is completed on a receiving silicon substrate or onto previously-printed silicon inks. During the retrieval step, the SMP stamp is heated prior to collapsing the full surface area of the SMP on a silicon ink. While the SMP stamp is collapsed conformally on the silicon ink, the SMP is cooled below $T_g$ to obtain the adhesion-on state. Vertical retraction allows retrieval of the ink from the donor substrate where the silicon ink was tethered. During the releasing step, the SMP stamp is heated to return to its adhesion-off state. The silicon ink is then released onto a desired receiving area or target structure. After retrieval-and-release cycle, the receiving substrate is moved to a furnace and annealed at 1000° C. for 5 min to bond the stacked silicon inks.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A microscale stamp for transfer printing, the microscale stamp comprising:
   a stamp body comprising a shape memory polymer having a glass transition temperature ($T_g$), the shape memory polymer comprising a deformable state at temperatures above $T_g$ and a rigid state at temperatures below $T_g$; and
   one or more protruding structures attached to a surface of the stamp body, the one or more protruding structures comprising a material different from the shape memory polymer and having a Young's modulus greater than a storage modulus of the shape memory polymer.

2. The microscale stamp of claim 1, wherein, when the shape memory polymer is in the rigid state, the microscale stamp comprises an adhesion capacity of at least about 0.1 MPa.

3. The microscale stamp of claim 2, wherein the adhesion capacity is at least about 1 MPa.

4. The microscale stamp of claim 1, wherein the shape memory polymer comprises epoxy, polyurethane, and/or (poly)ethylene-co-vinyl acetate (EVA).

5. The microscale stamp of claim 1, wherein the $T_g$ is from about 0° C. to about 300° C.

6. The microscale stamp of claim 1, wherein the surface of the stamp body comprises an area of from about 1 square micron to about 1 square millimeter.

7. The microscale stamp of claim 6, wherein, when in contact with an object to be transfer printed, the one or more protruding structures have a total contact area with the object of no more than about 25% of the area of the surface of the stamp body.

8. The microscale stamp of claim 1, wherein the one or more protruding structures each comprise an average linear size of from about 100 nm to about 50 microns.

9. The microscale stamp of claim 1, wherein the one or more protruding structures comprise a shape selected from the group consisting of: spherical, pyramidal and irregular.

10. The microscale stamp of claim 1, wherein the material of the one or more protruding structures is selected from the group consisting of: alumina, silica, zirconia, yttria, silicon nitride, aluminum nitride, silicon carbide, and stainless steel.

11. The microscale stamp of claim 1, further comprising a resistive heating element attached to the stamp body.

12. The microscale stamp of claim 11, wherein the resistive heating element comprises a transparent conductive oxide, a metal or metal alloy, and/or a conductive polymer composite.

13. The microscale stamp of claim 12, wherein the resistive heating element comprises the conductive polymer composite, and wherein the conductive polymer composite comprises the shape memory polymer with carbon particles dispersed therein.

14. The microscale stamp of claim 11, wherein the resistive heating element comprises an electrically conductive thin film having thickness of from about 100 nm to about 500 nm.

15. The microscale stamp of claim 11, wherein the resistive heating element spans an area of from about 1 square micron to about 10 square millimeters.

16. The microscale stamp of claim 1, wherein the $T_g$ of the shape memory polymer is above room temperature.

17. A microscale stamp for transfer printing, the microscale stamp consisting of:
   a stamp body consisting of a shape memory polymer having a glass transition temperature ($T_g$), the shape memory polymer comprising a deformable state at temperatures above $T_g$ and a rigid state at temperatures below $T_g$; and
   a resistive heating element attached to or embedded in the stamp body for localized heating of the shape memory polymer, the resistive heating element comprising a transparent conductive oxide and/or a conductive polymer composite.

18. The microscale stamp of claim 17, wherein, when the shape memory polymer is in the rigid state, the device comprises an adhesion capacity of at least about 0.1 MPa.

19. The microscale stamp of claim 17, wherein the resistive heating element comprises the transparent conductive oxide, and wherein the transparent conductive oxide comprises indium-tin oxide (ITO).

20. The microscale stamp of claim 17, wherein the resistive heating element comprises the conductive polymer composite, and wherein the conductive polymer composite comprises the shape memory polymer with carbon particles dispersed therein.

21. The microscale stamp of claim 17, wherein the resistive heating element comprises an electrically conductive thin film comprising thickness of from about 100 nm to about 500 nm.

22. The microscale stamp of claim 17, wherein the resistive heating element spans an area of from about 1 square micron to about 10 square millimeters.

23. The microscale stamp of claim 17, wherein the $T_g$ of the shape memory polymer is above room temperature.

24. A microscale stamp for transfer printing, the microscale stamp consisting of:
- a stamp body consisting of a shape memory polymer having a glass transition temperature ($T_g$), the shape memory polymer comprising a deformable state at temperatures above $T_g$ and a rigid state at temperatures below $T_g$; and
- a resistive heating element attached to or embedded in the stamp body for localized heating of the shape memory polymer, the resistive heating element comprising an electrically conductive thin film.

25. The microscale stamp of claim 24, wherein the electrically conductive thin film has a thickness of from about 100 nm to about 500 nm.

26. The microscale stamp of claim 24, wherein the electrically conductive thin film is a patterned electrically conductive thin film having a particular geometry.

27. The microscale stamp of claim 24, wherein the electrically conductive thin film comprises a metal or metal alloy or a conductive oxide.

* * * * *